United States Patent
Valcore et al.

(10) Patent No.: US 8,293,023 B2
(45) Date of Patent: Oct. 23, 2012

(54) SYSTEM AND METHOD FOR MONITORING WAFER STRESS

(75) Inventors: John Valcore, Mountain View, CA (US); Mark Kawaguchi, Sunnyvale, CA (US); Cristian Paduraru, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 278 days.

(21) Appl. No.: 12/616,415

(22) Filed: Nov. 11, 2009

(65) Prior Publication Data

US 2011/0094538 A1    Apr. 28, 2011

Related U.S. Application Data

(60) Provisional application No. 61/254,544, filed on Oct. 23, 2009.

(51) Int. Cl.
*B08B 7/04* (2006.01)
(52) U.S. Cl. ............................................. 134/18; 134/21
(58) Field of Classification Search ........................ None
See application file for complete search history.

(56) References Cited

U.S. PATENT DOCUMENTS

| 6,129,613 A * | 10/2000 | Bothra ............................. 451/66 |
| 2003/0022595 A1 * | 1/2003 | Lai et al. ............................ 451/5 |
| 2010/0283482 A1 | 11/2010 | Valcore |

* cited by examiner

*Primary Examiner* — Eric Golightly

(57) ABSTRACT

A method of using a processing system that is operable to deposit liquid and to remove liquid by way of negative pressure. The method includes arranging a device to have at least one of the liquid deposited thereon by the processing system and the liquid removed therefrom by the processing system. The device has a sensor portion disposed thereon. The sensor portion can provide a sensor signal based on pressure related to the at least one of the liquid being deposited thereon by the processing system and the liquid being removed therefrom by the processing system. The method further includes performing at least one of depositing, by the processing system, the liquid onto the device and removing the liquid, by the processing system, from the device. The method still further includes providing the sensor signal, by the sensor portion, based on the pressure related to the at least one of the liquid being deposited onto the device and the liquid being removed from the device.

2 Claims, 4 Drawing Sheets

SYSTEM AND METHOD FOR MONITORING WAFER STRESS

The present application claims priority from U.S. Provisional Application No. 61/254,544 filed Oct. 23, 2009, the entire disclosure of which is incorporated herein by reference.

BACKGROUND

Within the semiconductor industry, there exists the need to improve yield, throughput, and the ever present quest to maintain pace with Moore's Law. The ideal way of accomplishing a process characterization is to provide a mechanism for real-time data collection of vital process parameters—explicitly the mechanical and electrical forces seen by the substrate.

FIG. 1 illustrates a portion of a conventional linear wet chemical cleaning system 100.

As illustrated in FIG. 1, cleaning system 100 includes a holding tray 102, a carrier tray 104, a powered rail 112, attachment devices 110, 114, 126 and 130, a non-powered rail 128 and a cleaning portion 118. Cleaning portion 118 includes a plurality of process shower heads 120.

In operation, a wafer 108 may be disposed on carrier tray 104. Attachment devices 110 and 114 and attachment devices 126 and 130 attached to carrier tray 104 enable carrier tray 104 to glide along a path D between powered rail 112 and non-powered rail 128, respectively. As carrier tray 104 carrying wafer 108 passes underneath cleaning portion 118, process shower heads 120 apply cleaning solutions to the surface of wafer 108. Process shower heads 120 then remove the cleaning solution via vacuum. In this manner, any particulates on the surface of wafer 108 are removed.

In a wet cleaning process, cleaning solutions are applied to the surface of wafer 108 in conjunction with de-ionized water delivery & mixed liquid-gas return lines. Goals during such a process include maintaining a balanced force on the surface of wafer 108 resulting from the application of liquid and gas flows and optimizing the efficiency of the wet clean process. Controlling forces applied to wafer 108 during a wet clean process may increase uniformity and residual removal rates across the entire wafer surface.

What is needed is a system and method for controlling forces applied to a wafer during a wet clean process in order to increase uniformity and residue removal rates across the entire wafer surface.

BRIEF SUMMARY

It is an object of the present invention to provide a system and method for controlling forces applied to a wafer during a wet clean process in order to increase uniformity and residue removal rates across the entire wafer surface.

In accordance with an aspect of the present invention, a method is provided for using a processing system that is operable to deposit liquid and to remove liquid by way of negative pressure. The method includes arranging a device to have at least one of the liquid deposited thereon by the processing system and the liquid removed therefrom by the processing system. The device has a sensor portion disposed thereon. The sensor portion can provide a sensor signal based on pressure related to the at least one of the liquid being deposited thereon by the processing system and the liquid being removed therefrom by the processing system. The method further includes performing at least one of depositing, by the processing system, the liquid onto the device and removing the liquid, by the processing system, from the device. The method still further includes providing the sensor signal, by the sensor portion, based on the pressure related to the at least one of the liquid being deposited onto the device and the liquid being removed from the device.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with an aspect of the present invention, forces exerted on a wafer during semiconductor chemical cleaning process are monitored. Further, force vectors across the wafer surface area are extracted based upon wafer movement induced by liquids applied under pressure to the wafer surface during wet chemical clean processes. The monitored forces may then be used to adjust application of liquids and gases to the surface of a wafer and to adjust removal of materials from the surface of the wafer to optimize wafer yield.

Example embodiments of the present invention will now be described in reference to FIG. 2-FIG. 5.

Figure 1:
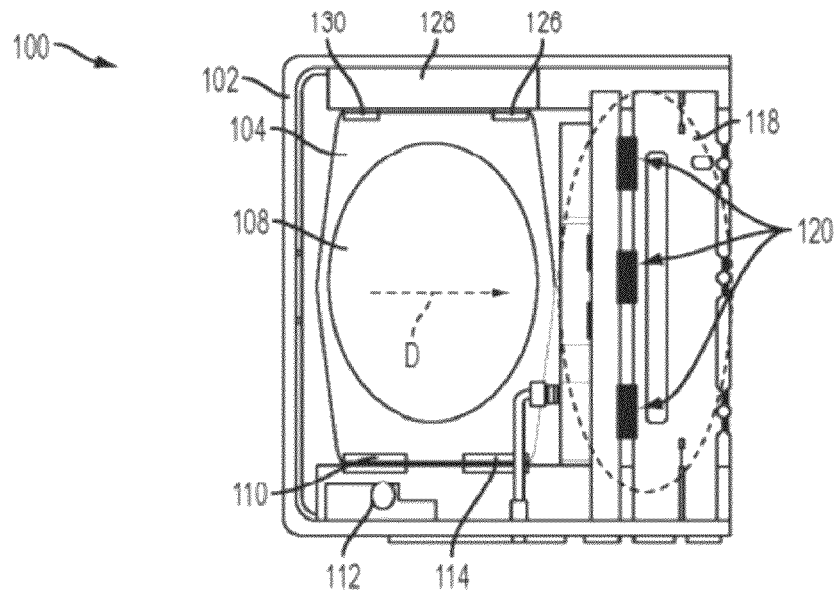
FIG. 1 illustrates a portion of a conventional linear wet chemical cleaning system 100.
Figure 2:
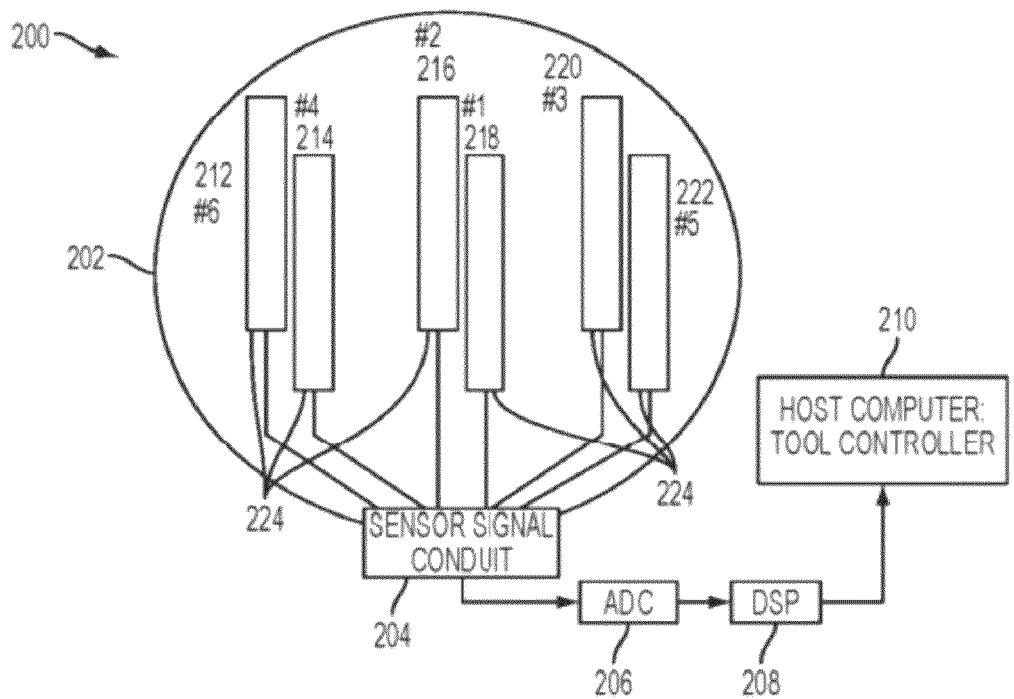
FIG. 2 illustrates a characterization apparatus in accordance with an aspect of the present invention.

FIG. 2 illustrates a characterization apparatus 200 in accordance with an aspect of the present invention:

As illustrated in FIG. 2, characterization apparatus 200 includes a wafer 202, a sensor signal conduit 204, an analog-to-digital converter (ADC) 206, a digital signal processor (DSP) 208 and a tool controller 210. Wafer 202 includes a set of vibration sensors 224 integrated on the surface. In an example embodiment, vibration sensors 224 are piezoelectric devices. In this particular embodiment, vibration sensor set 224 includes six sensors: sensor 212 (sensor #6), sensor 214 (sensor #4), sensor 216 (sensor #2), sensor 218 (sensor #1), sensor 220 (sensor #3), and sensor 222 (sensor #5).

In operation, wafer 202 is placed in cleaning system 100 and a given cleaning process begins. During the cleaning process, the sensors in vibration sensor set 224 each measure the local forces exerted on wafer 202, such as the forces due to the application of cleaning solution, the application of de-ionized water, and the removal of such liquids, residues and particulates with a vacuum. The individual signals from vibration sensor set 224 are passed to ADC 206 via sensor signal conduit 204, which are then passed through DSP 208 and eventually to tool controller 210. Tool controller 210 may be a program that displays and records the signal responses from each sensor in vibration sensor set 224.

Figure 3:
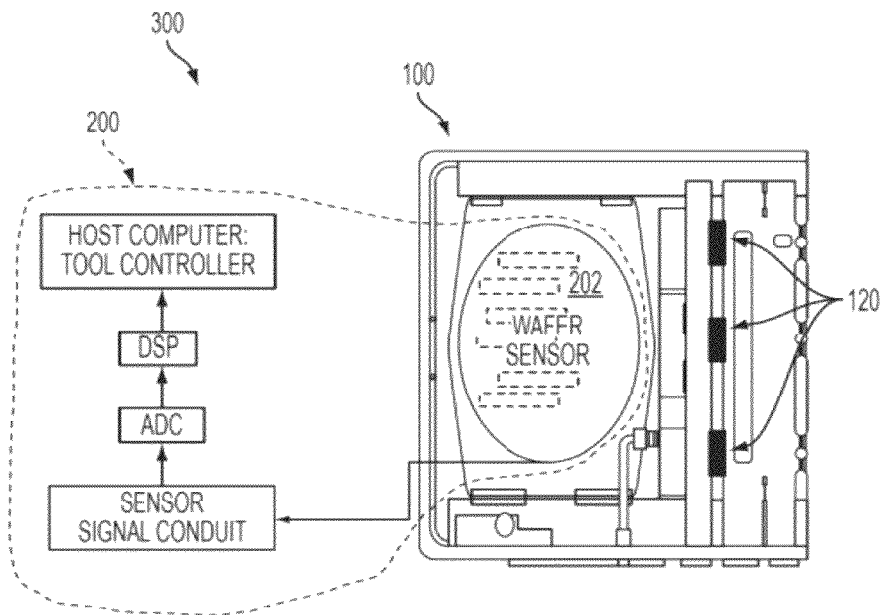
FIG. 3 shows a linear chemical cleaning and characterization system in accordance with an aspect of the present invention.

The operation discussed above is illustrated in FIG. 3. FIG. 3 shows a linear chemical cleaning and characterization system 300 in accordance with an aspect of the present invention.

Cleaning and characterization system 300 includes cleaning system 100 and characterization apparatus 200. As shown in the figure, wafer 202, which includes vibration sensors set 224, is placed in cleaning system 100. As discussed above, the signals from vibration sensor set 224 sense the various local forces on wafer 202 during the cleaning process. These individual sensor responses can be monitored and then correlated to specific process conditions, as will be discussed further with reference to FIG. 4.

Figure 4:
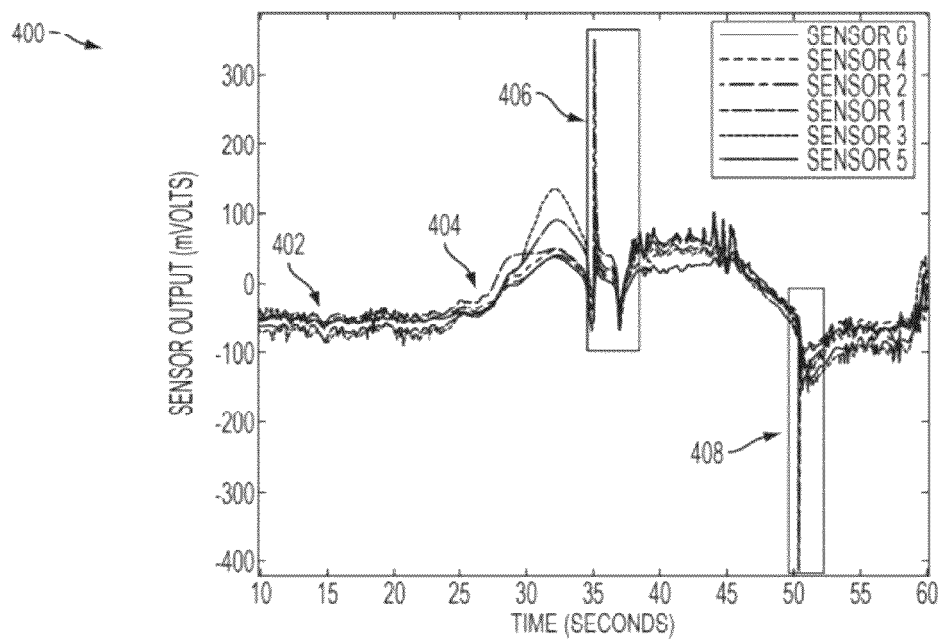
FIG. 4 shows a graph, which illustrates the signal response of each of the six sensors in a vibration sensor set during a particular cleaning process.

FIG. 4 shows a graph 400, which illustrates the signal response of each of the six sensors in vibration sensor set 224 during a particular cleaning process.

In graph 400, the x-axis is time, in seconds, whereas the y-axis is the sensor output, in millivolts, of each particular sensor. Graph 400 includes function set 402, a set of signal responses from the sensors in vibration sensor set 224. In this embodiment, there are six individual functions, one from each sensor in vibration sensor set 224.

Initially, the behavior of the responses in function set 402 is fairly constant, as wafer 202 begins gliding across holding tray 102. However, around point 404, a significant shift is present in each of the sensors responses. This can be correlated to wafer 202 beginning to move beneath process shower heads 120, and may represent the forces of the cleaning solution being applied to the surface of wafer 202. Shortly after point 404 in function set 402, there is a very sharp transient at point 406. This can be correlated to process shower heads 120 vacuuming the cleaning solution from the surface of wafer 202.

After the transient near point 406 settles, the responses in function set 402 remain somewhat constant before experiencing a sharp negative transient around point 408. This transient can be correlated to the point where wafer 202 has completed the pass beneath process shower heads 120 and the vacuum is no longer removing liquid from the surface of wafer 202.

As mentioned earlier, the individual responses in function set 402 represent the forces seen by the individual sensors in vibration sensor set 224. Therefore, the individual responses in function set 402 can provide a spatial map of the forces seen across wafer 202 during a given cleaning process. This allows any areas of non-uniformities or non-idealities in the way forces are applied to wafer 202 to be identified during the cleaning process. For example, for a given wafer 202, there may be maximum threshold of pressure that may be applied to it, above which may potentially cause damage or even breakage. Therefore, by monitoring the local forces on wafer 202 during the cleaning process, one can check if the applied pressure at any location on wafer 202 (from the application of cleaning solution, vacuum, etc) exceeds this given threshold. If so, then various processing parameters (such as amount of water or cleaning solution dispensed during cleaning, force or duration of vacuum, etc) may be appropriately adjusted to reduce the pressure on wafer 202.

In addition to maximum pressure threshold, there may be other pressure-related thresholds pertinent to a given wafer. For example, there may be a threshold for the maximum change in pressure over a given distance on the wafer. This may be monitored by examining the difference between individual sensor responses. Also, there may be a threshold for maximum change in pressure over a given time. This may be monitored by examining the gradient of the individual sensor responses as a function of time. In any case, if a threshold is exceeded, processing parameters may be adjusted to reduce the changes in pressure. For example, the rate at which water or cleaning solution is applied to wafer 202 or the force of the vacuum may be appropriately adjusted in order to reduce sudden changes in pressure during the cleaning process. Also, if process shower heads 120 are movable, they may be moved and rearranged such as to provide more uniform pressure across the surface of wafer 202.

Once the processing parameters are adjusted, wafer 202 undergoes the cleaning process again and the resulting effects on the sensor responses are observed. The cycle of processing and observing followed by adjusting of processing parameters may be repeated several times until the results are deemed to be acceptable (all sensor outputs fall within set thresholds). In this manner, wafer damage during cleaning can be avoided or reduced, thereby improving the yield and efficiency of the wet cleaning process. Once the cleaning process has been sufficiently optimized, wafer 202 may be removed and the cleaning process may be performed on regular production wafers.

For the sake of discussion, the ability to adjust the cleaning system to account for sensor outputs surpassing given thresholds will now be described in reference to FIGS. 5 and 6.

Figure 5:
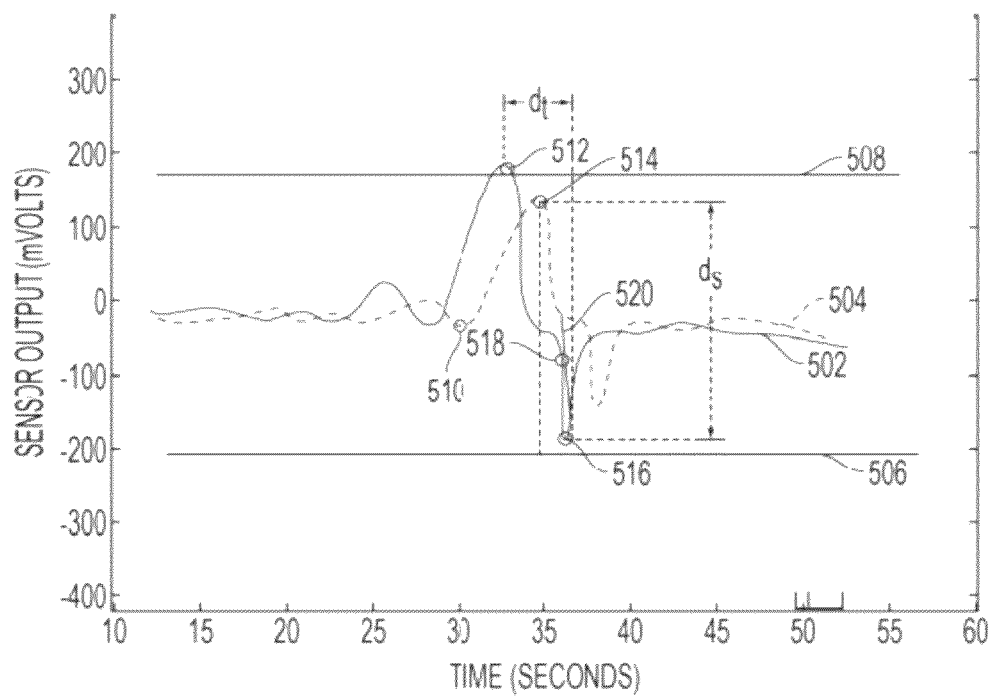
FIG. 5 shows a graph, which illustrates the signal response of two different sensors on a wafer during an example wet cleaning process.

FIG. 5 shows a graph 500, which illustrates the signal response of two different sensors on wafer 202 during an example wet cleaning process.

In graph 500, the x-axis is time, in seconds, whereas the y-axis is the sensor output, in millivolts, of each particular sensor. Graph 500 includes function 502 and function 504, which represent signal responses from different sensors in vibration sensor set 224 on wafer 202. For simplicity, in graph 500, the signal responses from only two sensors are shown.

Graph 500 also includes maximum negative pressure threshold 506 and maximum positive pressure threshold 508. These indicate a predetermined maximum amount of negative pressure and predetermined maximum amount positive pressure that may be applied to an area on wafer 202, respectively, before a likelihood of damage to wafer 202 will exceed a predetermined likelihood of damage threshold. These thresholds may be experimentally determined by monitoring yield of batched of cleaned wafers.

As shown in graph 500, at point 512, function 502 exceeds maximum positive pressure threshold 508. This indicates that the pressure at this sensor is too high and needs to be reduced, in order to reduce the likelihood of wafer damage below the predetermined likelihood of damage threshold. At point 516, function 502 does not surpass the maximum negative threshold 506, so the value of pressure there is acceptable.

However, note that there is a large change in pressure between point 514 on function 504 and point 516 on function 502. Since the points are relatively close in time, the difference in pressure between points 514 and 516 (noted as $d_{s1}$) represents the change in pressure sustained over the physical distance between the two sensors. In this example, presume the pressure change $d_{s1}$ divided by the distance between the two sensors is found to exceed a predetermined threshold for pressure change per distance on wafer 202. A predetermined threshold for pressure change per distance on wafer 202 is a threshold of pressure change per distance on wafer 202 before a likelihood of damage to wafer 202 will exceed a predetermined likelihood of damage. Since this threshold is exceeded, this is unacceptable and must be addressed.

In addition to changes in pressure over distance, there may also be established thresholds for changes in pressure over time. At point 518 on function 502, the gradient with respect to time is indicated by a line (line 520). As one can see, line 520 is almost completely vertical, indicating a very large change in pressure over time. In this example, presume the gradient at point 518 exceeds a pre-determined threshold for change in pressure with respect to time. A predetermined threshold for pressure change with respect to time is a threshold of pressure change at a position on wafer 202 over time before a likelihood of damage to wafer 202 will exceed a predetermined likelihood of damage. Since this threshold is exceeded, this is unacceptable and must be addressed Thus, in graph 500, there are three different instances where pre-determined thresholds were exceeded: 1) at point 512, the sensor corresponding to function 502 has exceeded the maximum (positive) pressure threshold; 2) between points 514 and 516, the threshold for maximum change in pressure over distance was exceeded; 3) at point 518, the sensor corresponding to function 502 has exceeded its threshold for maximum change in pressure with respect to time. All these must be addressed by appropriately adjusting the pressure sensed by the sensors corresponding to functions 502 and 504. As previously mentioned earlier, these adjustments may be accomplished in a variety of ways, such as adjusting the rate at which water or cleaning solution is applied, or adjusting the force and/or duration of the vacuum. Also, if process shower heads 120 are moveable, they may be rearranged such as to provide more uniform pressure to all the sensors. Once adjustments are made, the cleaning process may be run again and the new sensor outputs can be monitored to check if they fall within the established thresholds. This will be described in more detail with respect to FIG. 6.

Figure 6:
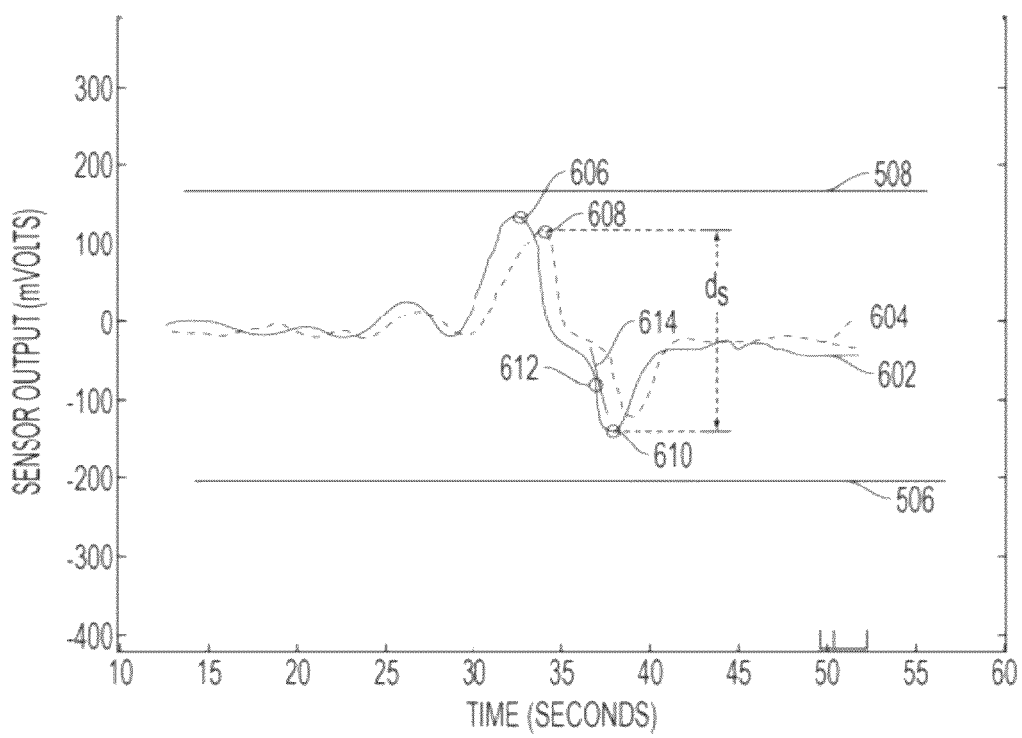
FIG. 6 shows a graph, which illustrates the signal response of the sensors corresponding to functions in FIG. 5 during an example wet cleaning process, after appropriate adjustments have been made.

FIG. 6 shows a graph 600, which illustrates the signal response of the sensors corresponding to functions 502 and 504 in FIG. 5 during an example wet cleaning process, after appropriate adjustments have been made.

In graph 600, the x-axis is time, in seconds, whereas the y-axis is the sensor output, in millivolts, of each particular sensor. Graph 600 includes function 602 and function 604, which represent signal responses from different sensors in vibration sensor set 224 of wafer 202. Function 602 corresponds to the same sensor that was associated with function 502 in FIG. 5, and function 604 corresponds to the same sensor that was associated with function 504 in FIG. 5.

As shown in FIG. 6, function 602 and 604 are now different from functions 502 and 504, due to adjustments in the cleaning process. Specifically, the maximum value of function 602 (point 606, which corresponds to point 512 on function 502) has been reduced, and now does not exceed the maximum positive pressure threshold 508. Also, the minimum value of function 602 (point 610, which corresponds to point 516 on function 502) has become less negative, such that the difference between point 608 of function 604 and point 610 of function 602 (denoted as $d_{s2}$) is now smaller than the maximum threshold for change in pressure over distance. Further, at point 612 on function 602 (which corresponds to point 518 on function 502), the gradient with respect to time (shown by line 614) has been reduced, such that it now falls within the threshold for maximum change in pressure over time. Thus, one can see that in FIG. 6 all the issues with sensors exceeding their predetermined pressure thresholds have been addressed via adjustments to the cleaning process. Now that the sensor outputs are within acceptable thresholds, there is less likelihood of wafer damage during the cleaning process, which thereby provides for a more efficient and higher-yield cleaning process.

Figure 7:
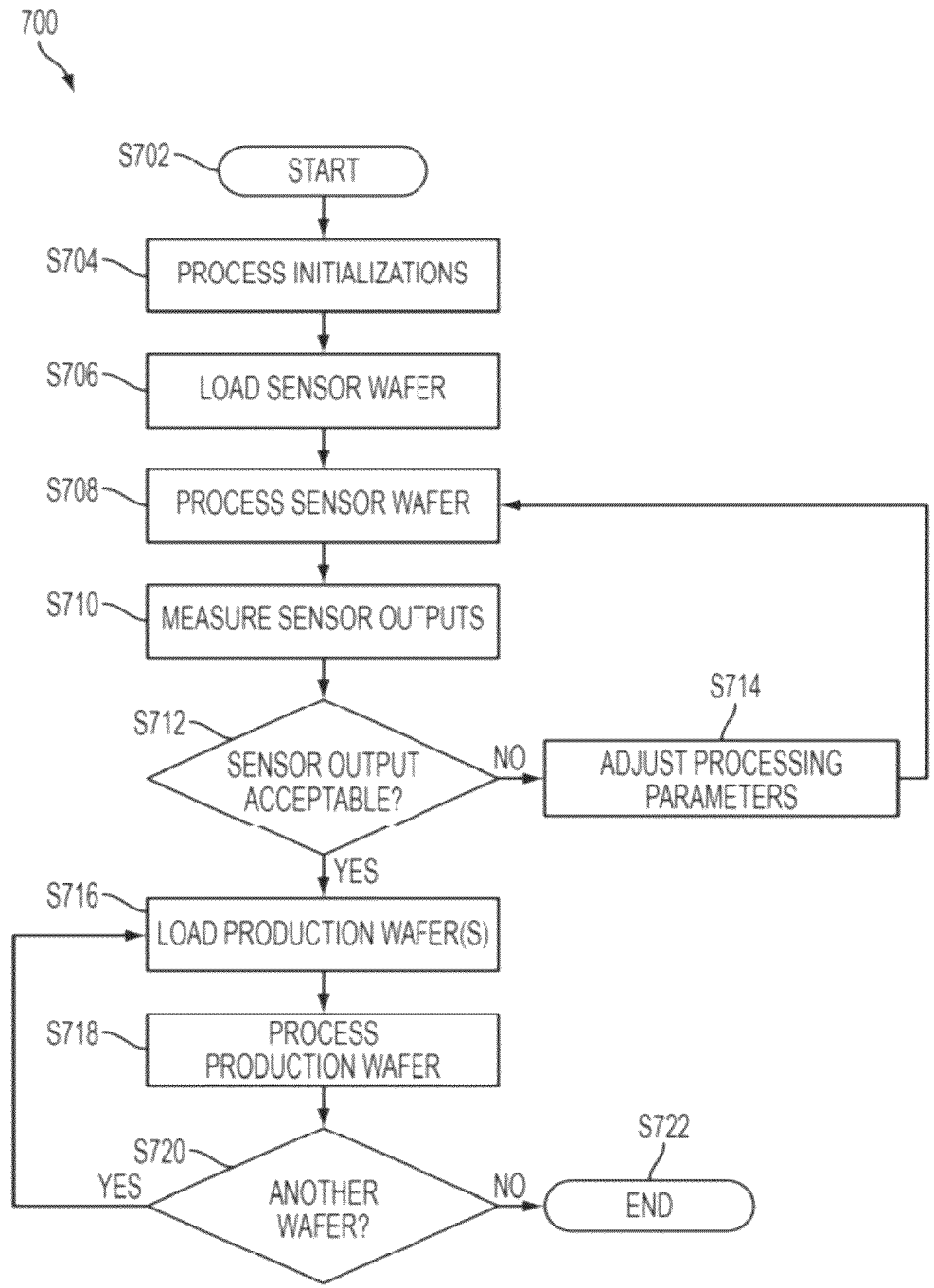
FIG. 7 is a flowchart illustrating an example method of operation of the cleaning and characterization system of FIG. 3 in accordance with an aspect of the present invention.

An example method of operating cleaning and characterization system 300 in accordance with an aspect of the present invention will now be described with reference to FIG. 7.

Process 700 starts (step S702) and process initializations occur (step S704). Non-limiting examples of process initializations include, establishing data communications or positioning parts in cleaning and characterization system 300. Process initializations may also include setting various process parameters such as the specific amount of water or cleaning solution to be applied (controlled by flow rate, etc), strength of the vacuum, and the specific time(s) when cleaning solution and/or vacuum is to be applied (and the duration of time applied). Also, initializations may include establishing thresholds for the pressure applied to wafer 202, as discussed previously (e.g. maximum pressure, maximum change in pressure with respect to distance, time, etc). Further, if process shower heads 120 are moveable, their initial position would be set in this step.

Then, a sensor wafer is loaded (step S706). Returning to FIG. 3, wafer 202, with vibration sensor set 224 integrated on its surface, is disposed on carrier tray 104.

Wafer 202 is then processed in cleaning and characterization system 300 (step S708).

After wafer 202 is processed, the individual sensor outputs of vibration sensor set 224 are monitored (step S710). The results are analyzed to determine if the individual sensor outputs of vibration sensor set 224 are all acceptable (all fall within the established thresholds) for the given process (step S712).

If any of the individual sensor outputs of vibration sensor set 224 are not deemed to be acceptable, then the appropriate process parameters are adjusted (step S714) and wafer 202 is processed again (step S708) with the new parameters. As discussed previously with reference to FIG. 4, the adjustments to process parameters may include adjusting the flow rate of water and/or cleaning solution from process shower heads 120, the position of process shower heads 120 (if movable), and/or the strength of vacuum used to remove cleaning solution and particles from the surface of wafer 202. The adjustments may be implemented manually or via an automatic feedback control system.

Returning to step S712, if all individual sensor outputs of vibration sensor set 224 are deemed to be acceptable, then wafer 202 is removed from carrier tray 104 and a production wafer is loaded onto carrier tray 104 (step S716).

The production wafer is then processed (step S718).

After the production wafer is processed, it is determined whether more production wafers need to be processed (step S720). If the determination is NO, then processing may conclude (step S722). Otherwise the next production wafer is loaded (step S716) and the process repeats.

In the above process, thresholds for certain parameters (maximum pressure on wafer, etc) are first established during initialization (step S704) and later the sensor outputs are checked to ensure they are all within the given thresholds (step S712). However, it may be the case that the parameter thresholds are not known prior to processing. Thus, in this case, the initialization step (step S704) would just include the other process initializations (positioning of process shower heads 120, setting strength of vacuum, etc) and step S712 may just include a general overview of the sensor outputs to determine whether or not the results are acceptable. If the sensor outputs are deemed unacceptable, then the process would go on to step S714 to adjust appropriate processing parameters, just as discussed previously.

In the embodiment discussed above with reference to FIG. 2, vibration sensor set 224 includes individual piezoelectric films. It should be noted however, that other embodiments may include sensors of other types, non-limiting examples of which include, sensors made of microelectrical mechanical systems (MEMs). Further, it should be noted that other embodiments may include any number of sensors integrated on the surface of wafer 202, in any sort of pattern.

In the embodiments discussed above in FIGS. 2-7, sensors are used to measure forces on a wafer during a wet clean process. It should be noted, however, that other embodiments may include sensors or other measuring devices that measure other parameters on a wafer during processing, non-limiting examples of which include temperature or acidity.

In the embodiments discussed above in FIGS. 3-7, forces on a wafer during a wet chemical cleaning process are monitored and optimized. It should be noted, however, than an aspect of the present invention is not limited to use with wet chemical cleaning systems. On the contrary, an aspect of the present invention may be implemented with any semiconductor system of interest. For example, the methodology can be applied to chemical mechanical polishing (CMP) processing systems to monitor pressure distribution across a wafer, or in MEMs applications where a spatial analysis of these stresses exerted on a substrate is required. Further, the methodology may be used in other systems to characterize the chucking force applied to a wafer by an electrostatic chuck (ESC). Specifically, the characterization apparatus in FIG. 2 may be used to measure the forces on a wafer applied by the chucking voltage of an ESC and therefore can allow for the examination of the uniformity of the clamping force across the wafer. By monitoring each sensor, a spatial map can be constructed of the relative clamp force at each sensor location, providing feedback to the user during ESC development as well as providing a problem-solving tool for chucking and de-chucking issues.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of using a linear cleaning system operable to deposit liquid and operable to remove liquid by way of negative pressure, said method comprising:

arranging a wafer to have the liquid removed therefrom by the linear cleaning system, the wafer having a sensor portion disposed thereon, the sensor portion being operable to provide a sensor signal based on pressure related to the liquid being removed therefrom by the linear cleaning system;

removing the liquid, by the linear cleaning system, from the wafer;

providing the sensor signal, by the sensor portion, based on the pressure related to the liquid being removed from the wafer;

determining a difference; and adjusting said removing the liquid, wherein said providing the sensor signal, by the sensor portion, based on the pressure related to the liquid being removed from the wafer comprises providing a first sensor signal by the sensor portion, based on the pressure related to the liquid being removed from the wafer at a first time and providing a second sensor signal, by the sensor portion, based on the pressure related to the liquid being removed from the wafer at a second time, wherein said determining a difference comprises determining whether a difference between the first sensor signal and the second sensor signal is above a threshold, and wherein said adjusting said removing the liquid comprises adjusting said removing the liquid, by the linear cleaning system, from the wafer when said determining comprises determining that the difference between the first sensor signal and the second sensor signal is above the threshold.

2. The method of claim 1, wherein said arranging a wafer comprises arranging a wafer having a sensor portion disposed thereon, the sensor portion having a first sensor and a second sensor, the first sensor being operable to provide a first sensor signal based on pressure related to the liquid being removed therefrom by the linear cleaning system, the second sensor being operable to provide a second sensor signal based on pressure related to the liquid being removed therefrom by the linear cleaning system, and wherein said providing the sensor signal comprises providing the first sensor signal, by the first sensor, based on the pressure related to the liquid being removed from the wafer and providing the second sensor signal, by the second sensor, based on the pressure related to the liquid being removed from the wafer.

* * * * *